(12) United States Patent
Ide et al.

(10) Patent No.: US 8,451,530 B2
(45) Date of Patent: May 28, 2013

(54) LASER SOURCE

(75) Inventors: Masafumi Ide, Tokorozawa (JP);
Takaaki Nozaki, Iruma (JP); Takeo Komiyama, Higashikurume (JP)

(73) Assignee: Citizen Holdings Co., Ltd., Tokyo (JP)

( * ) Notice: Subject to any disclaimer, the term of this patent is extended or adjusted under 35 U.S.C. 154(b) by 223 days.

(21) Appl. No.: 12/902,821

(22) Filed: Oct. 12, 2010

(65) Prior Publication Data
US 2011/0090557 A1 Apr. 21, 2011

(30) Foreign Application Priority Data
Oct. 15, 2009 (JP) ................................. 2009-238330

(51) Int. Cl.
*G02F 1/365* (2006.01)
*H01S 3/10* (2006.01)

(52) U.S. Cl.
USPC .................. 359/332; 359/328; 372/6; 372/22

(58) Field of Classification Search
USPC ............................ 359/326–332; 372/6, 21, 22
See application file for complete search history.

(56) References Cited

U.S. PATENT DOCUMENTS

| | | | |
|---|---|---|---|
| 4,901,123 A | 2/1990 | Noguchi et al. | |
| 6,785,457 B2 * | 8/2004 | Mizuuchi et al. | 385/129 |
| 6,839,376 B2 * | 1/2005 | Goto | 372/101 |
| 7,983,315 B2 * | 7/2011 | Wiedmann et al. | 372/21 |
| 8,098,422 B2 * | 1/2012 | Lee et al. | 359/326 |
| 2002/0071470 A1 | 6/2002 | Goto | |
| 2003/0189960 A1 | 10/2003 | Kitaoka et al. | |
| 2006/0250677 A1 * | 11/2006 | Hoffman et al. | 359/326 |
| 2009/0238220 A1 * | 9/2009 | Miller et al. | 372/22 |
| 2010/0303110 A1 * | 12/2010 | Bhagavatula et al. | 372/22 |

FOREIGN PATENT DOCUMENTS

| | | |
|---|---|---|
| EP | 0774684 A2 | 5/1997 |
| JP | 64057213 A | 3/1989 |
| JP | 2-146778 A | 6/1990 |
| JP | 06281982 A | 10/1994 |
| JP | 07-209560 A | 8/1995 |
| JP | 9197457 A | 7/1997 |
| JP | 2001330744 A | 11/2001 |
| JP | 2002176224 A | 6/2002 |
| JP | 2002374030 A | 12/2002 |

OTHER PUBLICATIONS

Japanese Office Action corresponding to Japanese Patent Application No. 2009-238330, dated Dec. 4, 2012.

* cited by examiner

*Primary Examiner* — Daniel Petkovsek
(74) *Attorney, Agent, or Firm* — Sughrue Mion, PLLC

(57) ABSTRACT

A laser source includes a laser device configured to emit laser light at a given angle with respect to a normal of an output end face; and an optical device configured to include an optical waveguide that guides and outputs the laser light. The output end face of the laser device is parallel to an input end face of the optical device, and the optical waveguide extends in a direction of $\theta_{w1}$ that is given by $\theta_{w1}=\arcsin(\sin\theta_{a1}/n_F)$, where $\theta_{a1}$ denotes an outgoing angle of the laser light from the laser device, and $n_F$ denotes an effective refractive index of the optical waveguide for the laser light.

5 Claims, 17 Drawing Sheets

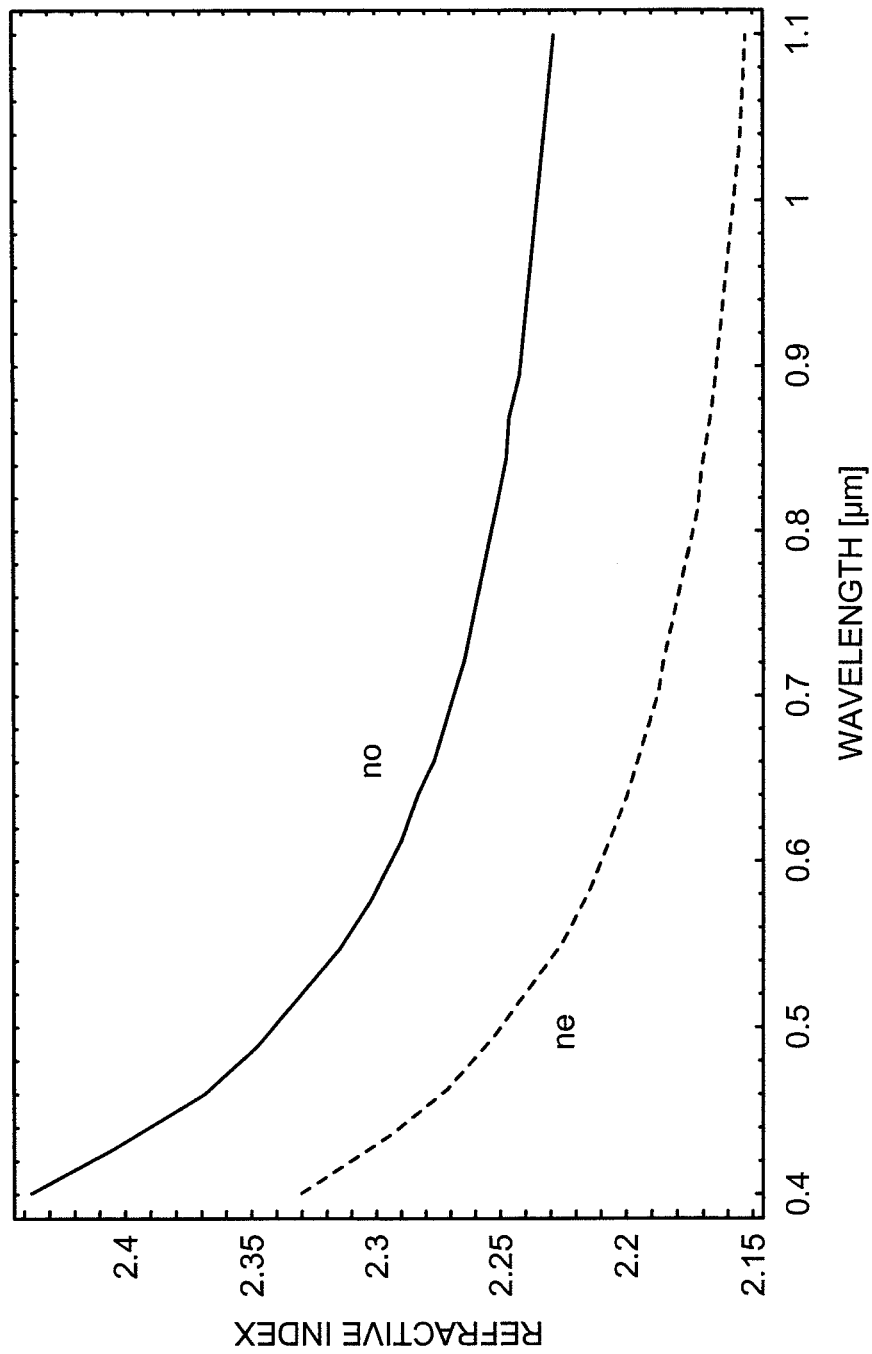

FIG.4B

| Coefficient | no | ne |
|---|---|---|
| A | 2.427 | 2.270 |
| B | 0.0146 | 0.01268 |
| C | 1.46 | 1.320 |
| D | 0.0555 | 0.051 |
| E | 9.00 | 6.00 |
| F | 420.0 | 400.0 |

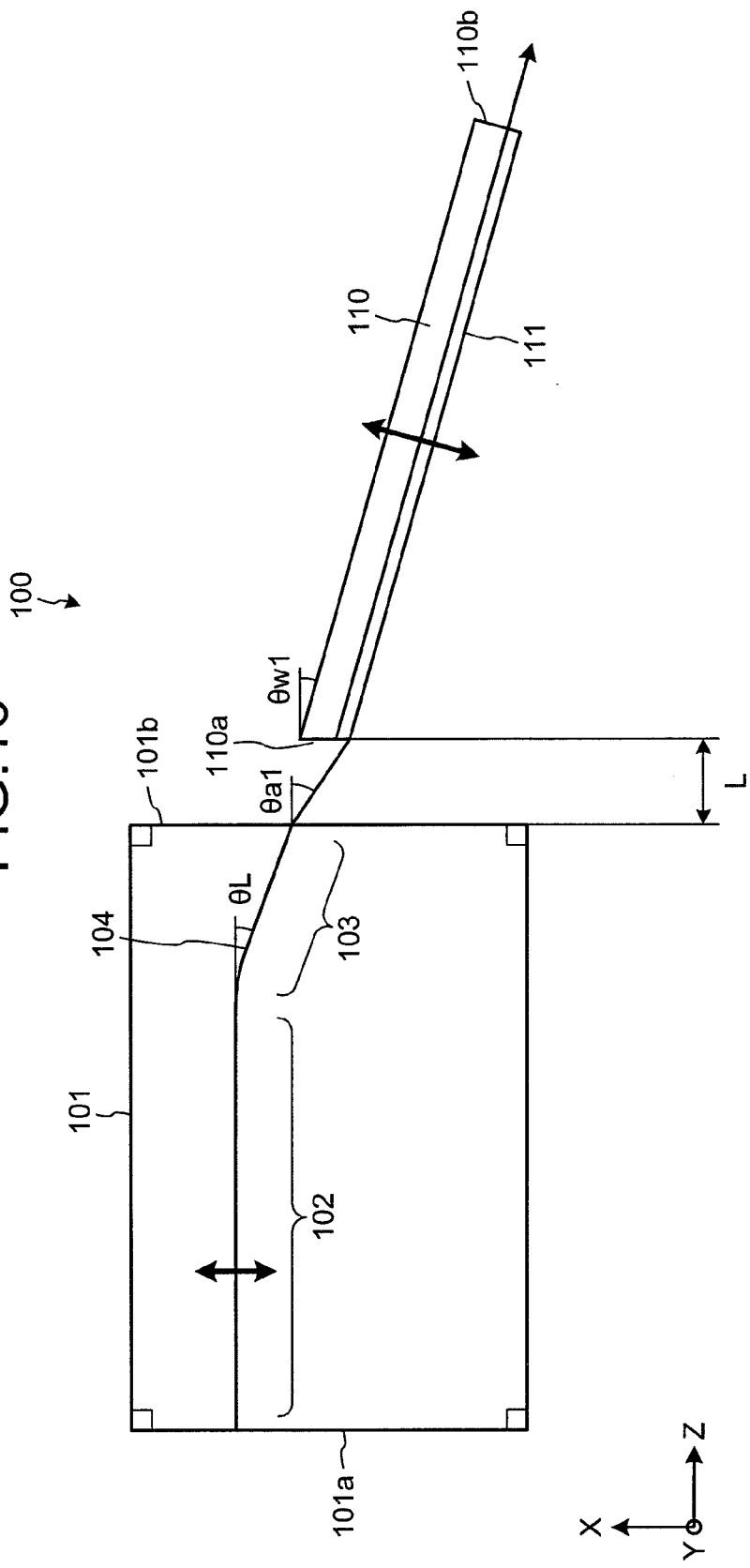

LASER SOURCE

BACKGROUND OF THE INVENTION

1. Field of the Invention

The embodiments discussed herein are related to a laser source having a laser device and an optical waveguide.

2. Description of the Related Art

A structure for reducing the reflection of light emitted from a laser diode (LD) at the laser diode and air interface is disclosed in Patent Document 1 (Japanese Laid-Open Patent Application Publication No. H2-146778). Patent Document 1 discloses a laser device in which a waveguide in a non-excitation region, outside an excitation region, is curved.

Optical devices that are coupled to the laser device for receiving laser light are, for example, an optical fiber and an optical waveguide. One example is a second harmonic generation (SHG) laser device that is a combination of a laser device and an SHG device. An example of a structure for coupling a laser device with an optical waveguide is disclosed in Patent Document 2 (Japanese Laid-Open Patent Application Publication No. H7-209560).

However, the direct coupling of the conventional laser device with an optical device has problems of large coupling loss or troublesome alignment of optical axes. Generally, a lens is inserted between the laser device and the optical waveguide. However, in this configuration, loss can be caused by the lens and the number of components increases because of the lens, driving up costs. Further, alignment of optical axes between the three parts including the lens is required and the size of the entire device becomes larger.

Although the structure disclosed in Patent Document 2 does not require a lens, end faces of the laser device and optical waveguide to be in contact with each other cannot be installed to be parallel, making the alignment of optical axes difficult. For the alignment of optical axes, it is preferable that the positioning of adjacent devices be determined along a z-axis, the optical axis, and with respect to x- and y-axes which are perpendicular to the z-axis.

However, according to Patent Document 2, positioning of optical devices along one axis cannot be determined independently: while one axis (for example, the z-axis) is adjusted, positions along the other axes (x and y axes) move. As a result, positions along multiple axes must be adjusted simultaneously and thus, the position adjustment of the devices becomes difficult.

In order to directly couple optical devices, the optical devices need to be placed in a close range. When the optical devices are coupled in an inclined state, end faces of the optical devices may contact each other, making adjustments to the alignment of optical axes impossible or on the contrary, the end faces of the optical devices may be spaced apart from each other, making direct coupling impossible.

SUMMARY OF THE INVENTION

In order to solve the above problems, the present application aims to provide a laser source that allows an end face of a laser device to be positioned near an end face of another optical device and that enables easy, direct coupling with lower loss.

In order to solve the above problems and achieve an object, a laser source according to the present invention includes a laser device configured to emit laser light at a given angle with respect to a normal of an output end face; and an optical device configured to include an optical waveguide that guides and outputs the laser light. The output end face of the laser device is parallel to an input end face of the optical device, and the optical waveguide extends in a direction of $\theta_{w1}$ that is given by $\theta_{w1} = \arcsin(\sin \theta_{a1}/n_F)$ where, $\theta_{a1}$ denotes an outgoing angle of the laser light from the laser device, and $n_F$ denotes an effective refractive index of the optical waveguide for the laser light.

According to the configuration above, laser light is emitted with lower loss from a laser device, and the laser light enters and is guided through a subsequent optical device sustaining less loss.

The optical device is a wavelength conversion element including the optical waveguide that wavelength-converts the laser light and outputs the laser light as converted light. The optical waveguide extends in a direction of $\theta_{w1}$ that is given by $\theta_{w1} = \arcsin(\sin \theta_{a1}/n_{eF})$, where $n_{eF}$ denotes an effective refractive index of the optical waveguide for a fundamental wave of the laser light.

According to the configuration above, laser light is emitted with lower loss from a laser device, and the laser light enters and is guided through a subsequent optical device sustaining less loss. In addition, since an input end face of the laser device and an input end face of the optical device are parallel, adjustment of optical axis can be easily conducted.

Further, an extraordinary light axis of crystal of the optical waveguide is perpendicular to the direction of $\theta_{w1}$.

The laser source satisfies $\theta_{w2} = \arctan(\sin \theta_{w1}/(n_{eSH} - \cos \theta_{w1}))$ and $\theta_{w2} + \theta_{w1} = \theta_{a2}$, where $n_{eSH}$ denotes an effective refractive index of the optical waveguide for the converted light, $\theta_{w2}$ denotes an angle between the direction of the optical waveguide and a normal of an output face of the wavelength conversion element, and $\theta_{a2}$ denotes a refraction angle of outgoing light with respect to the normal of the output face of the wavelength conversion element.

Polarized light of the laser light of the laser device is a TE mode along a substrate, and the wavelength conversion element is an x-cut or y-cut where polarization inversion is formed along a horizontal direction with respect to the substrate; or an x-cut or y-cut having a tilted angle within 10 degrees.

Polarized light of the laser light of the laser device is a TE mode along a substrate, and the wavelength conversion element is a z-cut where polarization inversion is formed in a direction perpendicular to the substrate or a z-cut having a tilted angle within 10 degrees.

The laser light of the laser device is directly coupled to the optical waveguide of the optical device.

The laser source further includes a base configured to hold the laser device so that the laser light is emitted from the laser device at the angle of $\theta_{a1}$; and a support member configured to be arranged on the base and support the optical device so that the optical waveguide has the angle of $\theta_{w1}$ taking account of the angle of the emitted laser light. The support member is arranged so that the support member is movable in a direction parallel to a face of the base independently of a direction perpendicular to the face of the base, and movable in the direction perpendicular to the face of the base independently of the direction parallel to the face of the base.

According to the configuration above, adjustment of optical axis can be conducted in a direction parallel to a face of a base independently of a direction perpendicular to the direction parallel to the face of the base, thereby facilitating the adjustment of optical axis even if laser light is emitted having a tilted angle from a laser device.

According to a laser source of the embodiments, an output end face of a laser device is parallel to an input end face of an optical device, thereby enabling direct coupling with the laser device and the optical device arranged in close range and providing a low loss laser source. Further, adjustment of optical axis can be easily conducted based on the output end face of the laser device and the input end face of the optical device.

BRIEF DESCRIPTION OF THE DRAWINGS

FIG. 4A is a diagram illustrating a refractive index dispersion characteristic against a wavelength for an LN substrate;
FIG. 4B is a diagram illustrating examples of Sellmeier coefficients;
FIG. 16 is a diagram illustrating a laser source according to another embodiment.

DETAILED DESCRIPTION OF THE PREFERRED EMBODIMENTS

Referring to the accompanying drawings, exemplary embodiments according to the present invention are explained in detail below.

Figure 1:
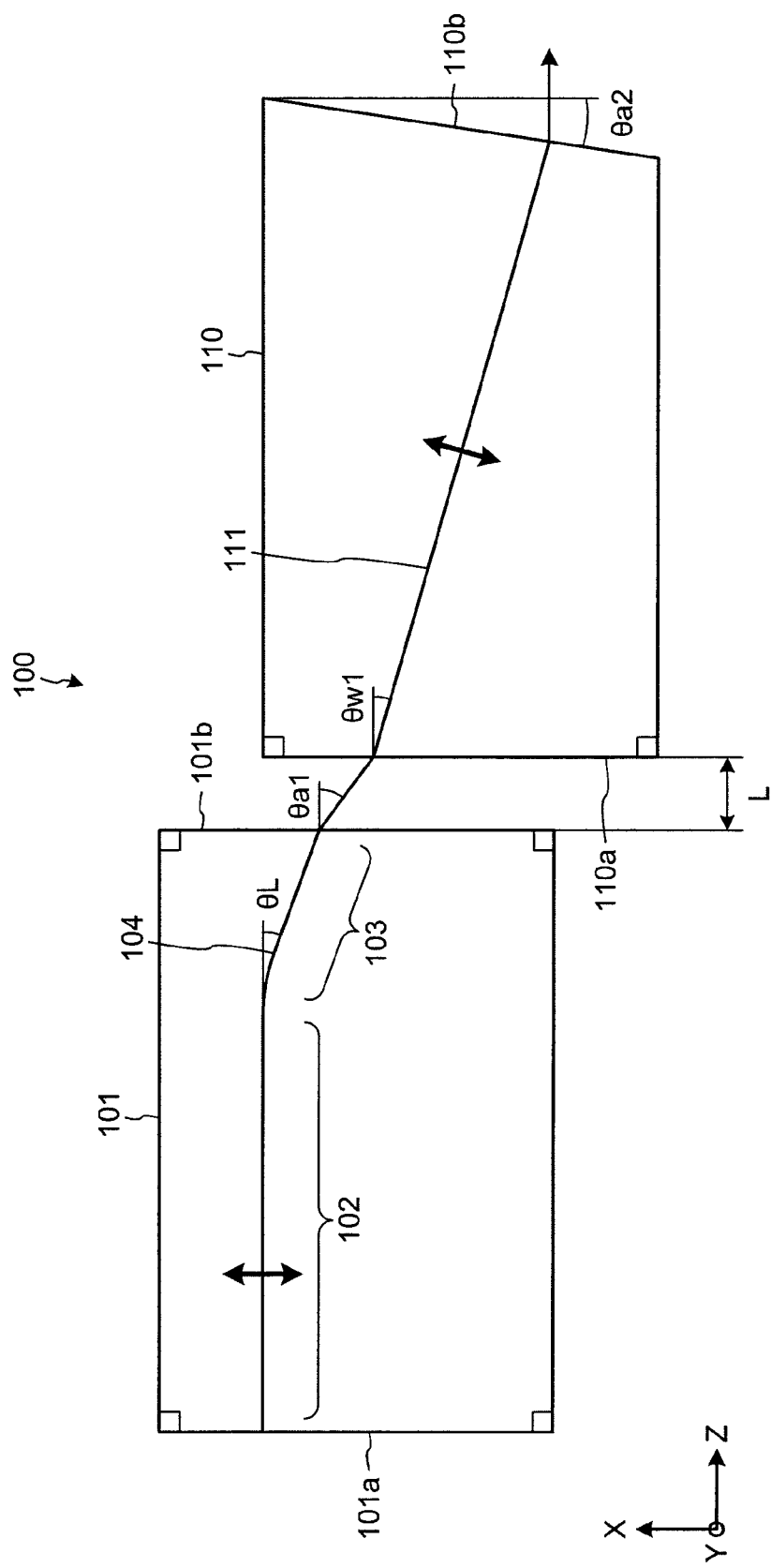
FIG. 1 is a diagram illustrating a structure of a laser source according to an embodiment.

Embodiment (Configuration of Laser Source)
In the explanation below, positions of devices are expressed with X-Y-Z (upper case letters) axes, and crystal axes of devices are expressed with x-y-z (lower case letters) axes.
FIG. 1 is a diagram illustrating a structure of a laser source according to an embodiment. In this figure, a horizontal direction is a Z-axis direction, a vertical direction is an X-axis direction, and a direction toward a reader is a Y-axis direction. A laser source 100 includes a laser device 101 and an optical device 110 that receives and guides laser light.
An active layer of a current injection region 102 of the laser device 101 is formed linearly in a direction perpendicular to an input end face 101a of the laser device 101. Light emitted from the current injection region 102 is guided by a curved optical waveguide 104 that runs through a non-excitation region 103 and is tilted at $\theta_L$ with respect to the z-axis. The light exits at a predetermined angle $\theta_{a1}$ with respect to a direction (z-axis direction) perpendicular to an output end face 101b of the laser device 101.

For simplicity, in this explanation, the current injection region 102 is a linear region and the curved waveguide is within the non-excitation region 103. However, The current injection region may be extended to the curved waveguide or the current injection region may be divided into two regions, one being an optical modulation region (phase or intensity) or an amplifier.

The optical device 110 includes an optical waveguide 111 and is made up of, for example, a wavelength conversion element. The optical device 110 includes an x-cut or y-cut periodically poled lithium niobate (PPLN) substrate where polarization inversion is formed along the horizontal direction with respect to the substrate. In FIG. 1, a two-headed arrow (↔) illustrates a polarization direction on an optical path. In this embodiment, the polarization direction (TE mode) is in parallel with a plane of the substrate. A substrate of the wavelength conversion element may be an x-cut or y-cut substrate having a tilt angle within 10 degrees with respect to a face of the substrate.

An input end face 110a of the optical device 110 is placed apart at a predetermined distance L from and in parallel with the output end face 101b of the laser device 101 (in parallel with the x-axis). The optical device 110 includes a linear optical waveguide 111 tilted at a given angle $\theta_{w1}$ with respect to a normal (in parallel with the z-axis) that is perpendicular to the input end face 110a. An output end face 110b of the optical device 110 is tilted at a given angle $\theta_{a2}$ with respect to the x-axis and the light goes out along the z-axis.

In the laser source 100, the output end face 101b of the laser device 101 and the input end face 110a of the optical device 110 are in parallel. Thus, the output end face 101b of the laser device 101 and the input end face 110a of the optical device 110 can be placed in a close range, enabling direct coupling of the laser device 101 and the optical device 110.

Examples of the wavelength conversion element are a quasi phase matching (QPM) device, a second harmonic generation (SHG) device which mainly uses a second harmonic (SH). When the optical device 110 is an SHG device, a SHG laser source can be obtained (details will be described later). Since the laser device 101 and the optical device 110 can be closely arranged and be directly coupled, costs are reduced and the need for an additional device such as a lens for coupling is eliminated, downsizing the device in the z-axis direction. Furthermore, since the output end face 101b of the laser device and the input end face 110a of the optical device 110 are in parallel, adjustment of the optical axis in the z-axis direction is conducted independently of adjustment of the optical axis in the x, y directions, facilitating adjustment of the optical axes.

Figure 2:
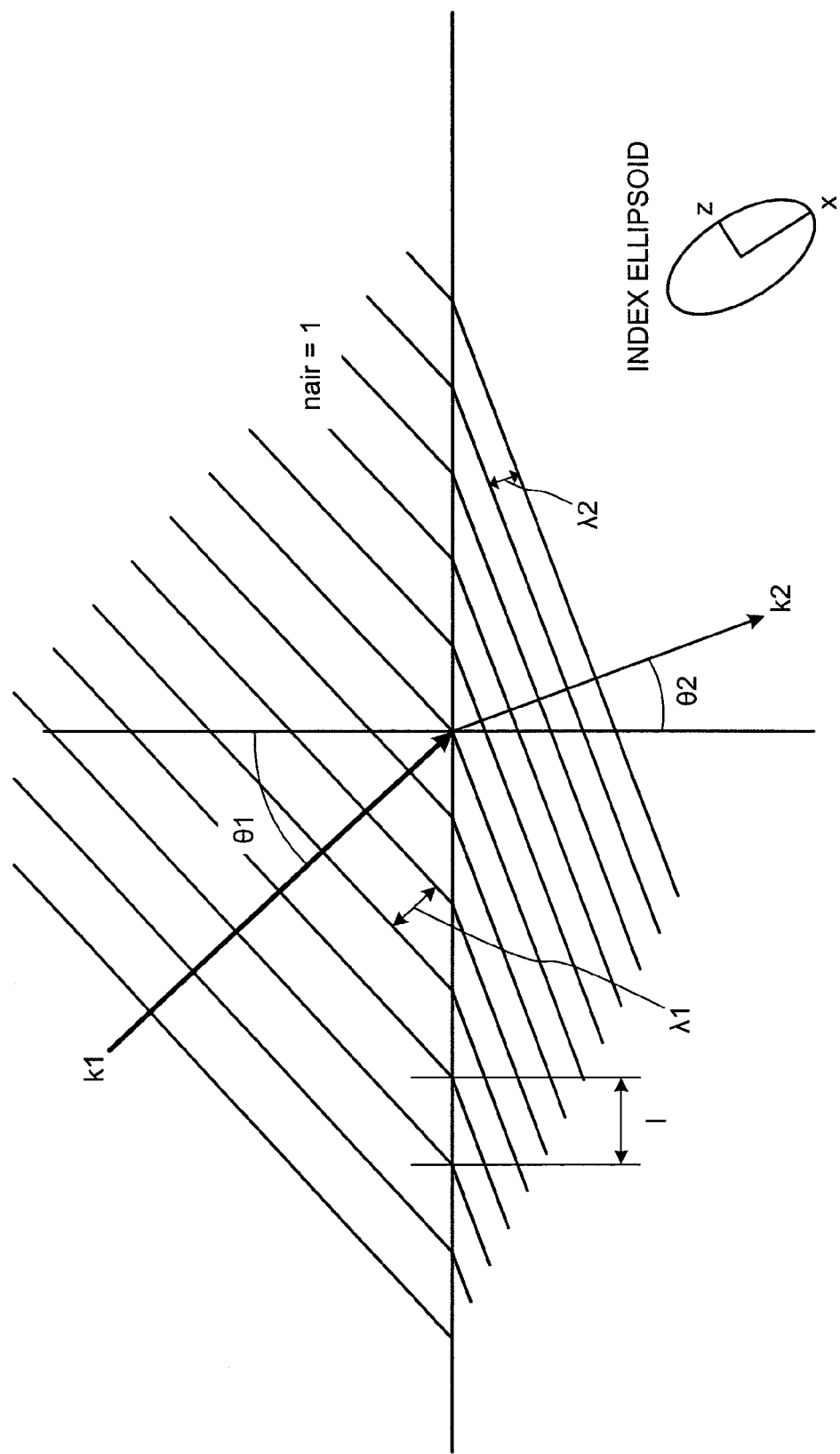
FIG. 2 is a diagram illustrating refraction of light in a waveguide.

(Discussion of Refraction in Waveguide)
FIG. 2 is a diagram illustrating refraction of light in a waveguide. An interface of a nonlinear optical crystal (NLC) of anisotropic media is illustrated and for simplicity, an explanation is given under plane wave approximation without considering a structure of the waveguide. It is assumed that light comes through air ($n_{air}=1$). When incident light travels from a medium with a lower refractive index to a medium with a higher refractive index (in this case, the NLC), generally part of the light is reflected at the interface and the rest are refracted. It is assumed here that ideal anti-reflective (AR) coating has been applied to a surface of the NLC and thus reflection is not considered.

Further, in an anisotropic medium, a wave normal vector $k_1$ of incident light and a wave normal vector $k_2$ of outgoing light satisfy a boundary condition determined by a relation between an optical indicatrix of the medium and an orientation of polarization components of the incident light. For simplicity, it is assumed here that the anisotropic medium is a negative uniaxial crystal ($n_o > n_e$).

$$\lambda_1 : \lambda_2 = c/n_1 : c/n_2 \qquad (1)$$

In equation (1), $\lambda_1$ and $\lambda_2$ denote wavelengths on an incident side and an outgoing side respectively, c denotes the speed of light, and $n_1$ and $n_2$ denote refractive indexes at incoming and outgoing respectively. From a boundary condition (matching of electric field vectors parallel to an interface), equation (2) below holds between incident angle $\theta_1$ and wavelength $\lambda_1$, and outgoing angle $\theta_2$ and wavelength $\lambda_2$ with reference to FIG. 2.

$$l \sin \theta_1 = \lambda_1,$$

$$l \sin \theta_2 = \lambda_2 \qquad (2)$$

Letter l denotes a component of a wavelength projected onto the interface. From equations (1) and (2), equation (3) expressing a relation between incident light and refracting light is derived.

$$n_1 \sin \theta_1 = n_2 \sin \theta_2 \qquad (3)$$

Equation (3) expresses Snell's law. Next, actual crystal orientation is hypothetically given. A c-axis of the NLC (LN is assumed here) is set to be parallel to the z-axis. When the direction of the normal $k_2$ of the refracted light becomes parallel, $$n_2 = n_e \qquad (4)$$

Figure 3:
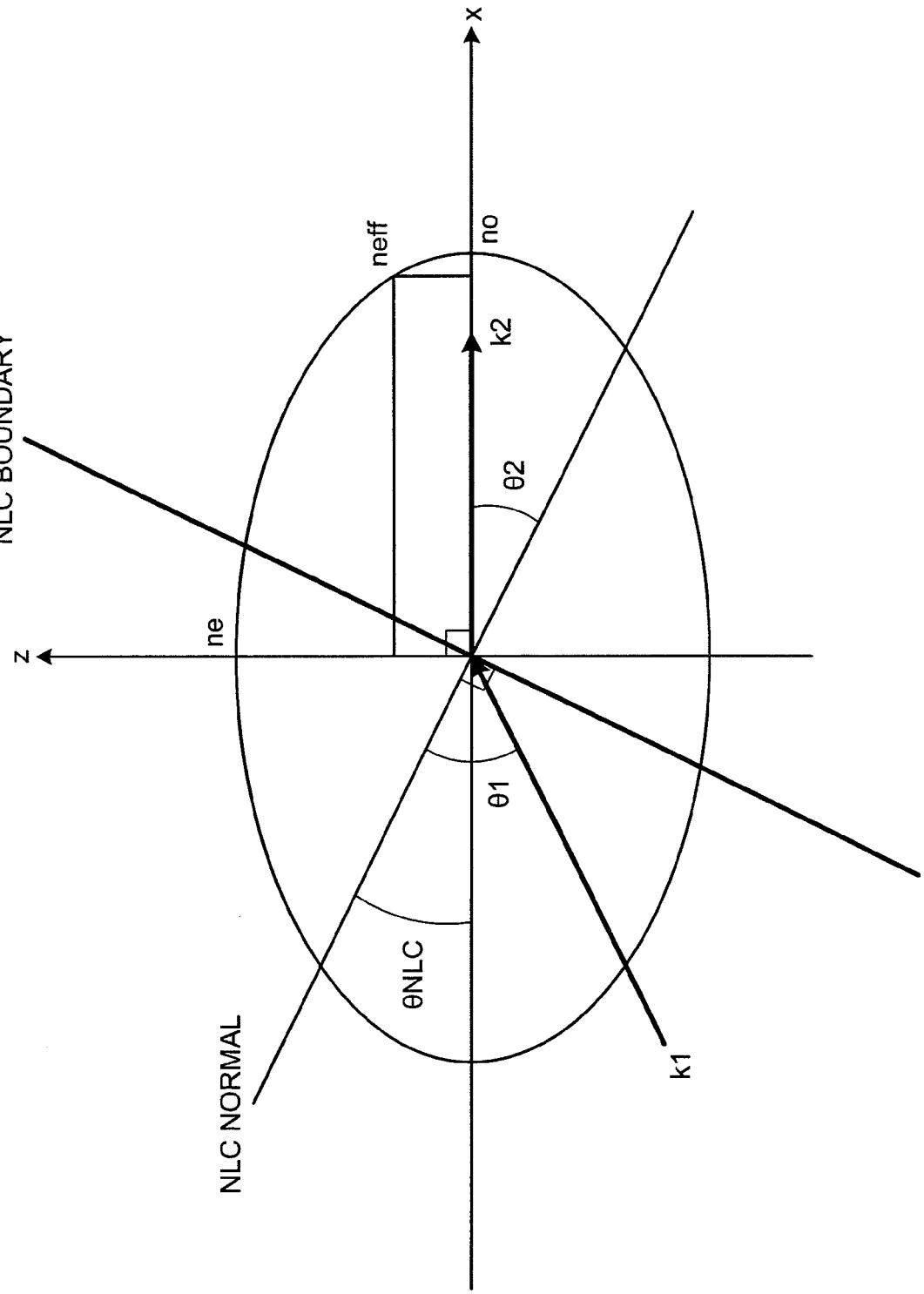
FIG. 3 is a diagram illustrating parameters of the optical indicatrix.

Equation (4) is substituted into equation (3). FIG. 3 is a diagram illustrating parameters of the optical indicatrix. As can be seen from angles depicted in FIG. 3, when a crystal interface of the NLC is set to satisfy equation (3), an angle $\theta_{NLC}$ between a crystal axis and a normal of the interface is determined so that $$\theta_{NLC} = \eta_2 \qquad (5)$$

It is preferable that an orientation of a waveguide which is described later is parallel to the crystal axis. A refractive index $n_e$ of extraordinary light used for obtaining $\theta_{NLC}$ is an effective refractive index taking account of a structure of waveguide or a range of temperature.

(Refraction Index Dispersion Characteristics with LN (Lithium Niobate) Substrate)

Based on the Sellmeier equation, a refractive index dispersion characteristic of a 5 mol % MgO doped LN substrate is discussed. FIG. 4A is a diagram illustrating a refractive index dispersion characteristic against a wavelength for an LN substrate. A dispersion characteristic of refractive indexes $n_e$ and $n_o$ of the 5 mol % MgO doped LN substrate based on the Sellmeier equation is depicted. For example, a 3-term Sellmeier equation is expressed by equation (6) below. FIG. 4B is a diagram illustrating examples of Sellmeier coefficients.

$$n^2 - 1 = \frac{A\lambda^2}{\lambda^2 - B} + \frac{C\lambda^2}{\lambda^2 - D} + \frac{E\lambda^2}{\lambda^2 - F} \qquad (6)$$

According to FIG. 4A, when a wavelength of light (fundamental wave) emitted by the laser device 101 is 1064 nm, a refractive index of extraordinary light of the NLC $n_{eF}=2.15622$ at 30 deg C. When the wavelength is 532 nm, the wavelength of an SH wave, $n_{eSH}=2.23451$ at 30 deg C.

(Coupling of Laser Device and Optical Device: Part 1)

Figure 5:
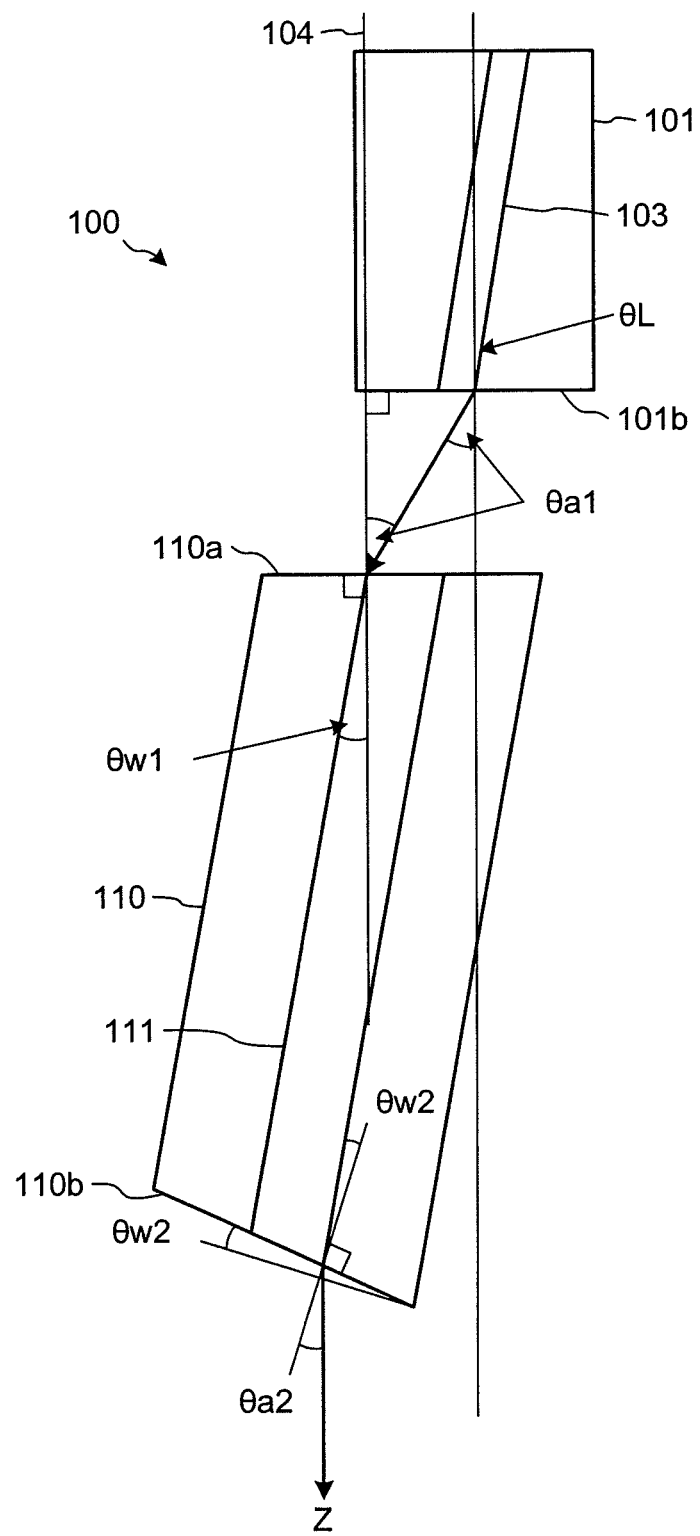
FIG. 5 is a diagram illustrating a first example of the coupling of the laser device and the optical device.

FIG. 5 is a diagram illustrating a first example of the coupling of the laser device and the optical device. Polarized light of the optical device (LD) 101 is in TE mode. The optical device (QPM) 110 is a y-cut PPLN. The output end face 101b of the LD 101 having a curved waveguide is in parallel with the input end face 110a of the QPM 110.

In FIG. 5, a normal 104 of both the output end face 101b of the LD 101 and the input end face 110a of the QPM 110 is set to be parallel to the Z-axis. A direction of outgoing light defined as $\theta_{a2}$ in FIG. 5 is within 10 degrees with respect to the normal 104 (Z-axis). The direction of outgoing light defined by $\theta_{a2}$ is preferably parallel to the normal 104.

The LD 101 includes a waveguide curved at $\theta_L$ with respect to the Z-axis. When an output angle of light from the output end face 101b of the LD 101 is $\theta_{a1}$, a refraction angle $\theta_{w1}$ with respect to the normal of the input end face 110a of the QPM 110 is expressed as equation (7) below where an effective refractive index of extraordinary light for an incoming fundamental wave is denoted by $n_{eF}$.

$$\theta_{w1} = \arcsin(\sin \theta_{a1} / n_{eF}) \qquad (7)$$

From the definition of angles in FIG. 5, equations (8) and (9) below hold.

$$\theta_{w2} + \theta_{w1} = \theta_{a2} \qquad (8)$$

$$n_{eSH} \sin \theta_{w2} = \sin \theta_{a2} \qquad (9)$$

$n_{eSH}$ is an effective refractive index of extraordinary light for an SH wave. From equations (7), (8), and (9), equation (10) below is obtained.

$$\theta_{w2} = \arctan(\sin \theta_{w1} / (n_{eSH} - \cos \theta_{w1})) \qquad (10)$$

Figure 6:
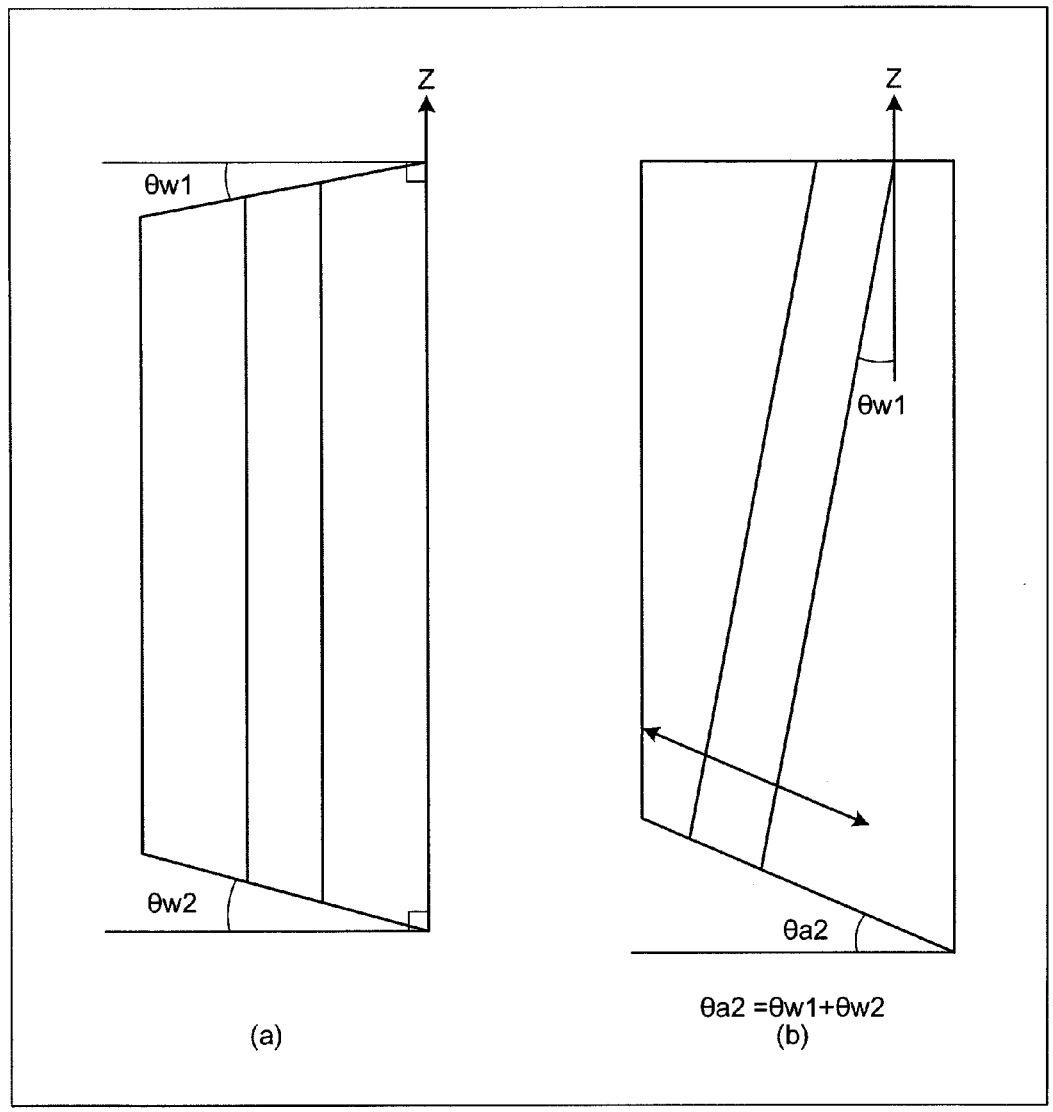
FIG. 6 is a diagram illustrating two examples of angles concerning end faces of the optical device.

FIG. 6 is a diagram illustrating two examples of angles concerning end faces of the optical device. Specific angles of the input end face 110a and the output end face 110b of the QPM 110 are explained. For example, it is assumed that $\theta_{a1}$ in FIG. 5 equals to 20.9°. It is also assumed that refractive indexes obtained from FIG. 4A are effective refractive indexes. In this case, from equations (7), (10), and (8), $\theta_{w1} = 9.52315$ [deg]

$\theta_{w2} = 7.54987$ [deg]

$\theta_{a2} = 17.073$ [deg].

When $\theta_{a1}$ equals to 17.5°, from equations (7), (10), and (8), $\theta_{w1} = 8.01658$ [deg]

$\theta_{w2} = 6.39505$ [deg]

$\theta_{a2} = 14.416$ [deg].

(Coupling of Optical Device and Optical Fiber)

Figure 7:
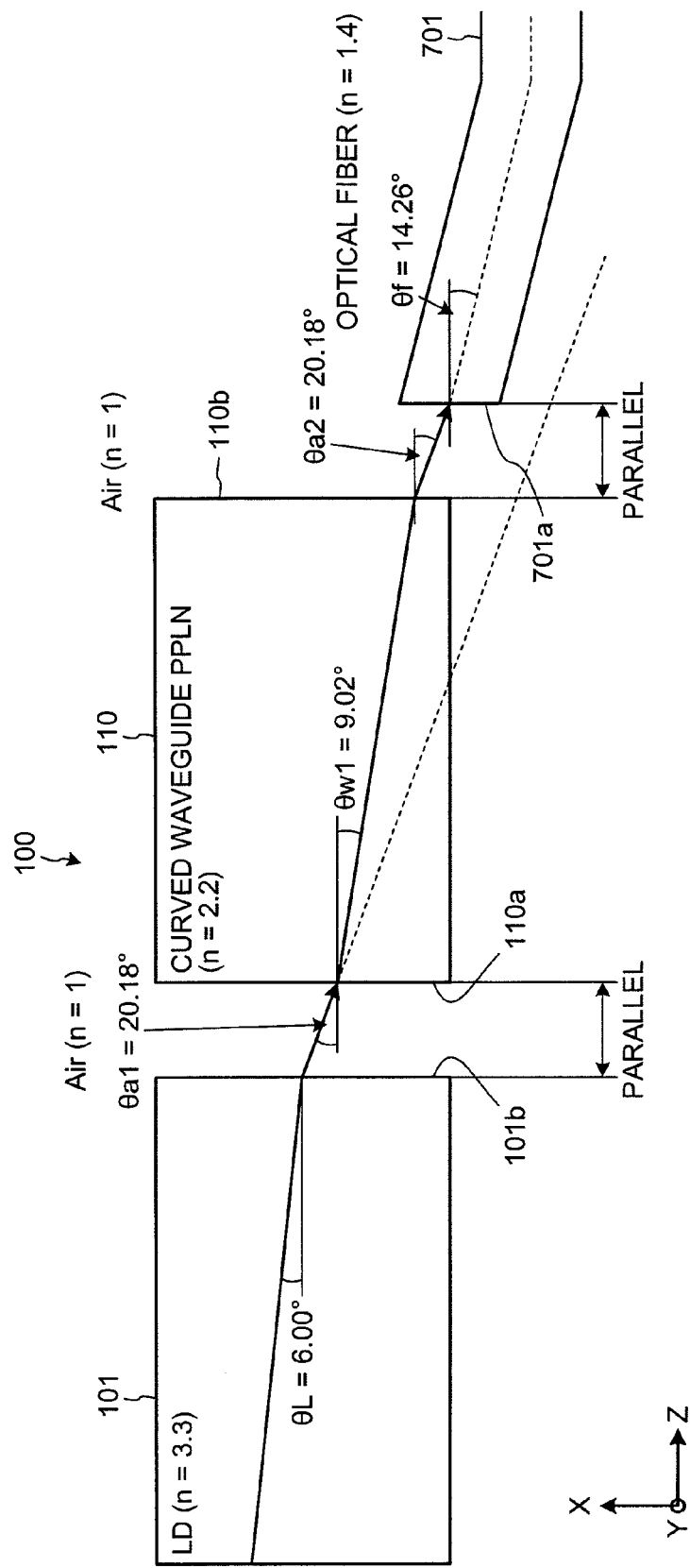
FIG. 7 is a diagram illustrating an example of coupling an optical device with an optical fiber having a slanted end face.

FIG. 7 is a diagram illustrating an example of coupling an optical device with an optical fiber having a slanted end face. In this configuration, light outgoing from the output end face 110b of the QPM 110 is input into an optical fiber 701 with an input face 701a having been cut obliquely. The output end face 110b of the QPM 110 and the input end face 701a of the optical fiber 701 are arranged in parallel and numerical values in this configuration are depicted. Light enters the LD 101, the QPM 110, and the optical fiber 701 through air (n=1) and refractive index n of the optical fiber is set to 1.4.

When the waveguide of the LD 101 is bent at angle $\theta_L$; light is output from the output end face 101b of the LD 101 at angle $\theta_{a1}$; a refraction angle with respect to the normal of the input end face 110a of the QPM 110 is $\theta_{w1}$; light is output from the output end face 110b of the QPM 110 at angle $\theta_{a2}$; and light enters an input end face 701*a* of the optical fiber 701 at angle $\theta_f$, values are as follows: $\theta_L$=6.00[deg], $\theta_{a1}$=20.18[deg], $\theta_{w1}$=9.02[deg], $\theta_{a2}$=20.18[deg], $\theta_f$=14.26[deg]. If $\theta_L$=10.00 [deg], then $\theta_{a1}$=34.96[deg], $\theta_{w1}$=15.10[deg], $\theta_{a2}$=34.96 [deg], $\theta_f$=24.16[deg]. In this configuration, $\theta_{a1}$ becomes equal to $\theta_{a2}$.

(Coupling of Laser Device and Optical Device: Part 2)

Figure 8:
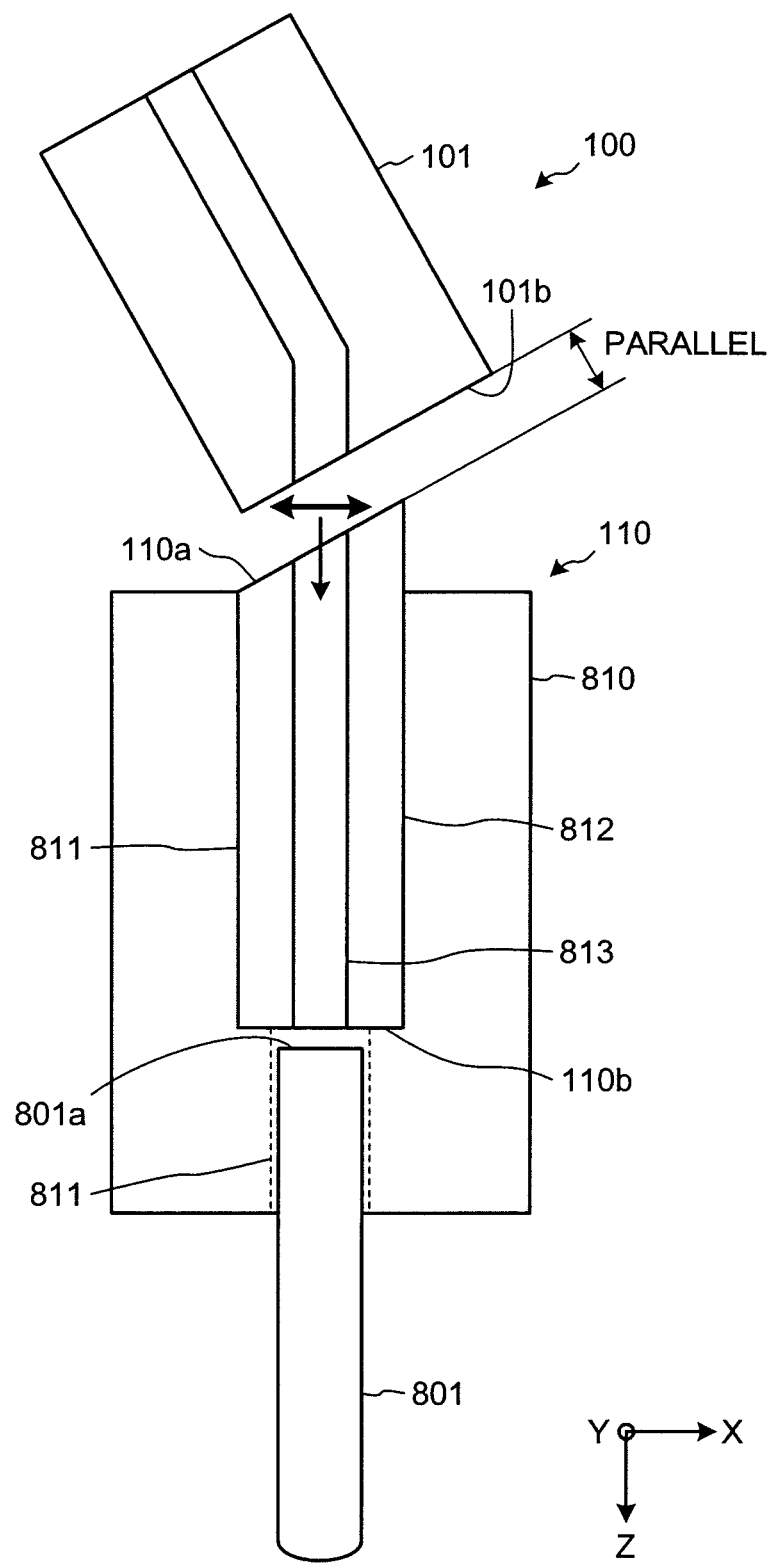
FIG. 8 is a diagram illustrating a second example of coupling a laser device with an optical device.

FIG. 8 is a diagram illustrating a second example of coupling a laser device with an optical device. In this example, the optical device 110 is an SHG device, forming an SHG laser. The input end face 110*a* of the QPM 110 is arranged in parallel with the output end face 101*b* of the LD 101. The output end face 110*b* of the QPM 110 is arranged in parallel with an end face 801*a* of an optical fiber 801 on an output side with a given gap therebetween.

The QPM 110 is configured in a manner such that a V-shaped groove 811 is formed on a Si base material by wet etching (anisotropic), and a y-cut PPLN 812 with a waveguide's side facing the V-shaped groove 811 is placed on the V-shaped groove 811 and the position is determined. The V-shaped groove 811 is also formed on a surface where the optical fiber 801 is disposed. The V-shaped groove 811 is formed along the Z-axis in order to adjust optical axes.

The SHG laser above takes similar form as a module that does not include a curved waveguide. Further, since the V-shaped groove 811 is formed on the Si base material 810 by the wet etching and the QPM 110 is extended face-down (a waveguide 813 facing downward) along the Z-axis, the V-shaped groove 811 determines position of the optical fiber 801 and provides room for the waveguide 813, having advantages of realizing the two objectives in one continuous structure and process.

(Coupling of Laser Device and Optical Device: Part 3)

Figure 9:
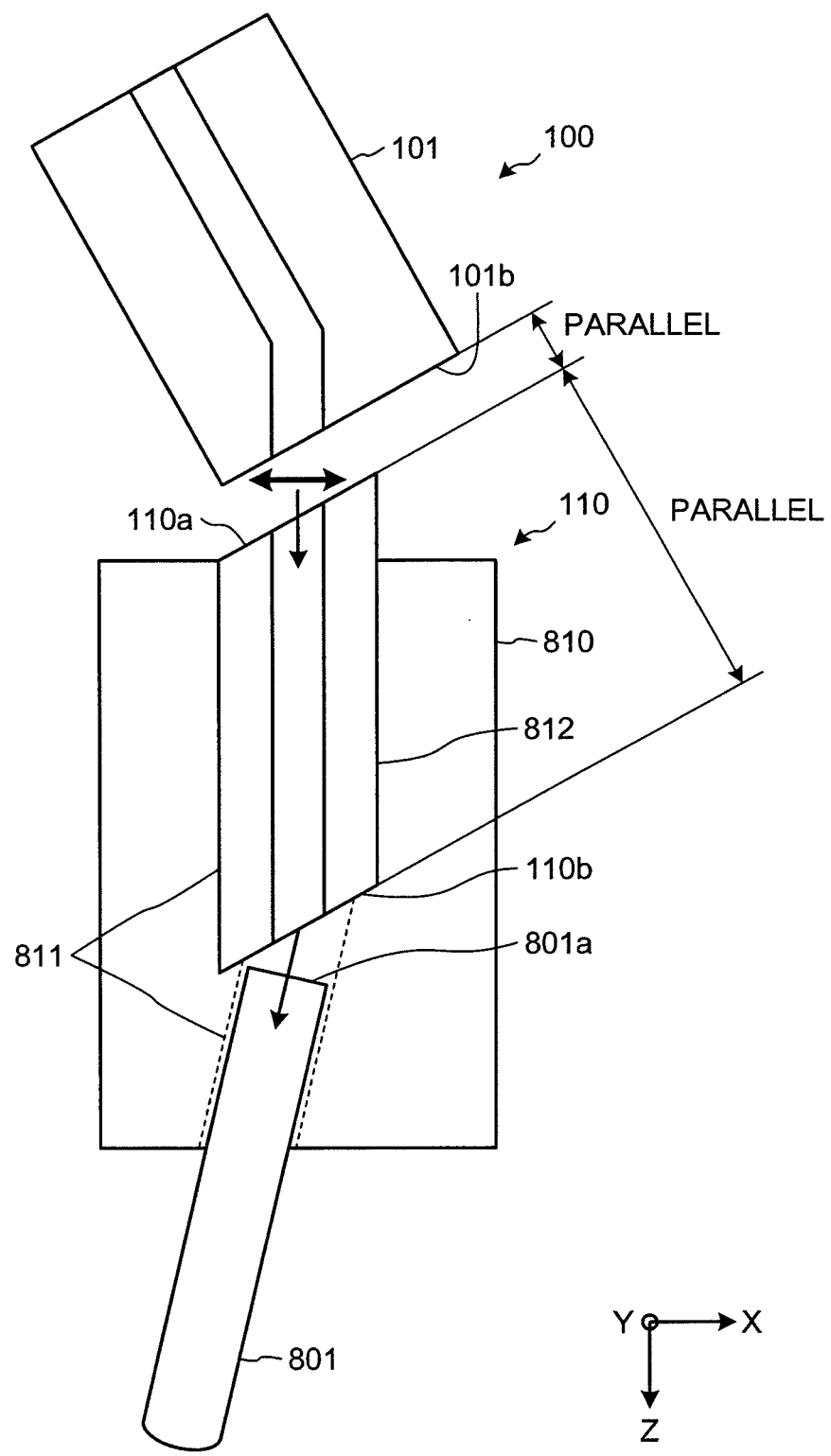
FIG. 9 is a diagram illustrating a third example of coupling a laser device with an optical device.

FIG. 9 is a diagram illustrating a third example of coupling of a laser device and an optical device. The optical device 110 is an SHG device. The input end face 110*a* of the QPM 110 is arranged in parallel with the output end face 101*b* of the LD 101, the direction being the Y-axis (X-Y plane) for alignment of axes. Further, the output end face 110*b* of the QPM 110 is cut at an angle to become parallel to the input end face 110*a*.

In this case, the V-shaped groove 811 is formed such that an angle of the optical fiber 801 with respect to the waveguide of the QPM 110 is $\theta_{a2}$, the output angle of the QPM 110. According to the configuration above, the input end face 110*a* of the QPM 110 is parallel to the output end face 110*b*, facilitating formation of the two end faces. In addition, an angle $\theta_{a1}$ of light outgoing from the LD 101 becomes equal to an angle $\theta_{a2}$ of light outgoing from the QPM 110, thereby providing an SHG laser of which adjustment is easy.

(Coupling of Laser Device and Optical Device: Part 4)

Figure 10:
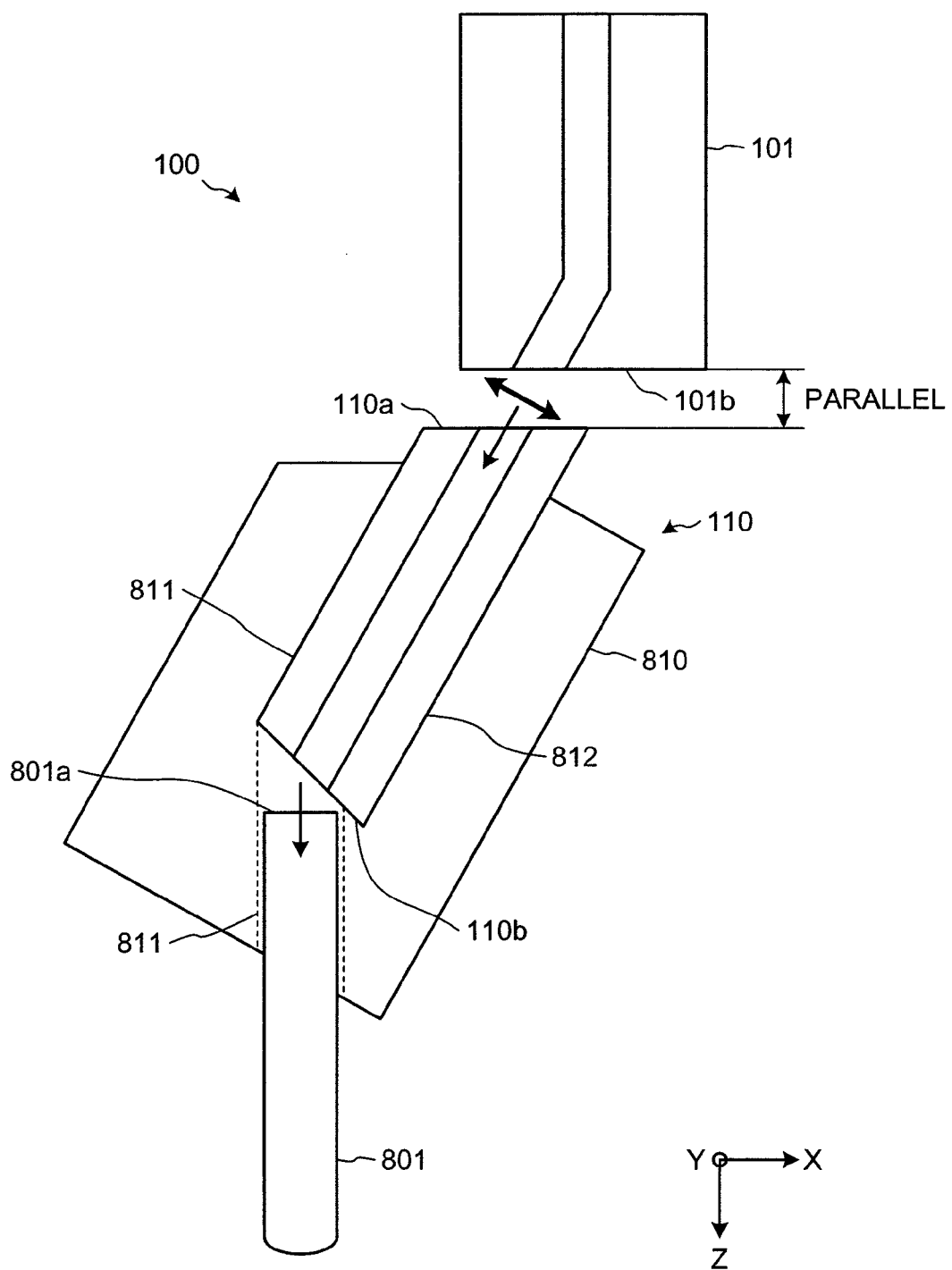
FIG. 10 is a diagram illustrating a fourth example of coupling of a laser device and an optical device.

FIG. 10 is a diagram illustrating a fourth example of coupling of a laser device and an optical device. The optical device 110 is an SHG device. The input end face 110*a* of the QPM 110 is arranged in parallel with the output end face 101*b* of the LD 101, the direction being the Y-axis (X-Y plane) for alignment of axes. The optical fiber 801 is disposed along the Z-axis. The output end face 110*b* of the QPM 110 is obliquely cut.

In this case, the QPM 110 takes a trapezoidal shape, cutting the input end face 110*a* and the output end face 110*b*. When the cut is performed individually, usual dicing and polishing are used. On the other hand, when a wafer is processed, laser or dry etching is used. According to the configuration, an SHG laser emits light to the optical fiber 80 parallel to the Z-axis direction.

EXAMPLE

Configuration of Module of Laser Source

Figure 11:
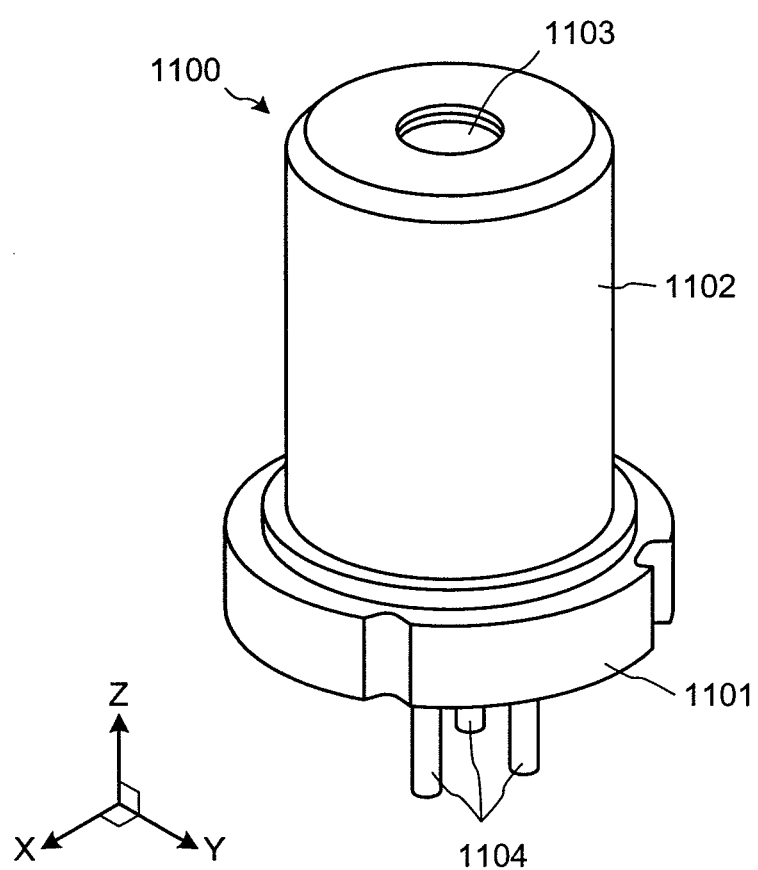
FIG. 11 is oblique perspective view illustrating one example of a module of the laser source.

An embodiment describing a module of a laser source including the LD and the optical device will be explained. FIG. 11 is oblique perspective view illustrating one example of the module of the laser source. As depicted in FIG. 11, a laser source 1100 is a TO-can package type with a cap 1101 being mounted on a base 1101.

The cap 1102 is processed into a cylindrical shape by drawing a thin plate of stainless steel (SUS). A filter 1103 through which laser light is emitted is set in an opening on an upper face. Lower part is welded by electric resistance welding onto the base 1101. In this way, TO-can package is provided where the LD 101 and the optical device 110 (SHG device 1205 which will be described later) is hermetically sealed. The filter 1103 blocks, for example, red laser or infrared laser light that can be a fundamental wave, and transmits SH wave laser light such as wavelength-converted green laser. From the base 1101, multiple lead terminals 1104 for driving a laser source protrude.

The laser source 1100 is an SHG laser source that wavelength-converts with an SHG device laser light emitted by the laser device (LD) and emits laser. The X-axis and Y-axis are set on a plane face of the base 1101 and the z-axis is taken in the direction perpendicular to the X-Y plane.

Figure 12:
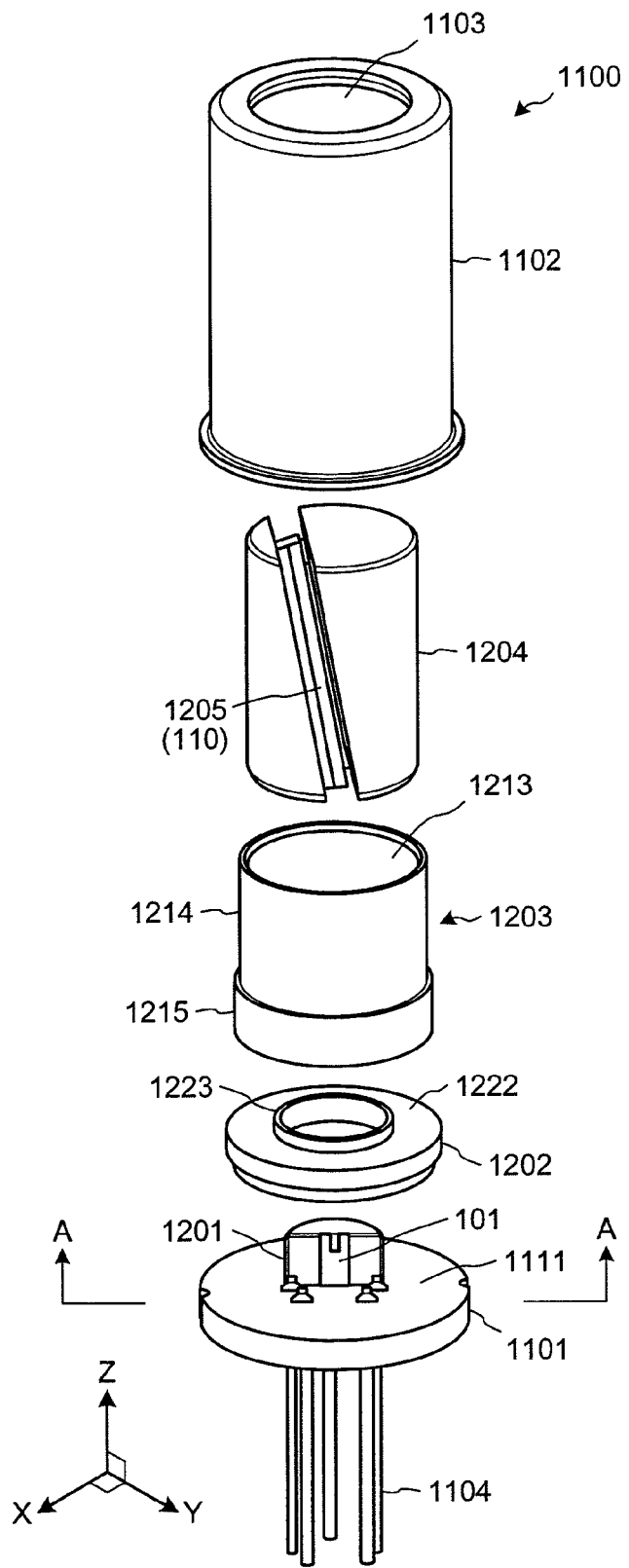
FIG. 12 is an exploded perspective view of a laser source.

FIG. 12 is exploded perspective view of a laser source. The base 1101 is made of, for example, SPC or Kovar. Au plating is done on the surface of the base 1101. A block 1201 extends in the Z-axis direction on the base 1101 and the laser device (LD) is fixed on the side of the block 1201. The block 1201 is formed together with the base 1101 or is fastened onto the base 1101 by, for example, welding. The LD 101 is electrically connected with the lead terminals 1104 by wire bonding (not shown).

On the base 1101, a circular support 1202, a flange 1203, an SHG device holder 1204 are loaded and fixed in this order from the bottom. The SHG device holder 1204 holds the SHG device 1205 (the optical device 110 above). The flange 1203 includes a cylindrical torso part 1214 with a guide hole 1213 and also includes a flange part 1215 having a larger cylindrical shape below the torso part 1214. The flange 1203 is made of, for example, SUS304.

The support 1202 is a cylindrical shape with flange and includes an annular flat face 1222 that slidably contacts an undersurface of the flange 1203. Along an inner circumference of the flat face 1222, a cylindrical protruding divider 1223 is formed. An undersurface of the flange part 1215 contacts the flat face 1222 of the support 1202 so that the flange 1203 is stably movable in the X-axis and Y-axis direction. A central axis of the flange 1203 is parallel to a direction (Z-axis) perpendicular to the upper plane face of the base 1101.

An undersurface of the support 1202 is connected to a plane part 1111 of the base 1101 by brazing or adhesion. The height of the flat face 1222 in the Z-axis direction is a little lower than an emission point of the LD 101.

The divider 1223 of the support 1202 has, for example, a height between the emission point of the LD 101 and the flat face 1222. As explained below, the divider 1223 protects the emission point of the LD 101 from things such as contaminant and oxide or from materials sputtered by laser spot welding of the flange 1203 and the support 1202 that is conducted at the final process of adjustment.

Figure 13:
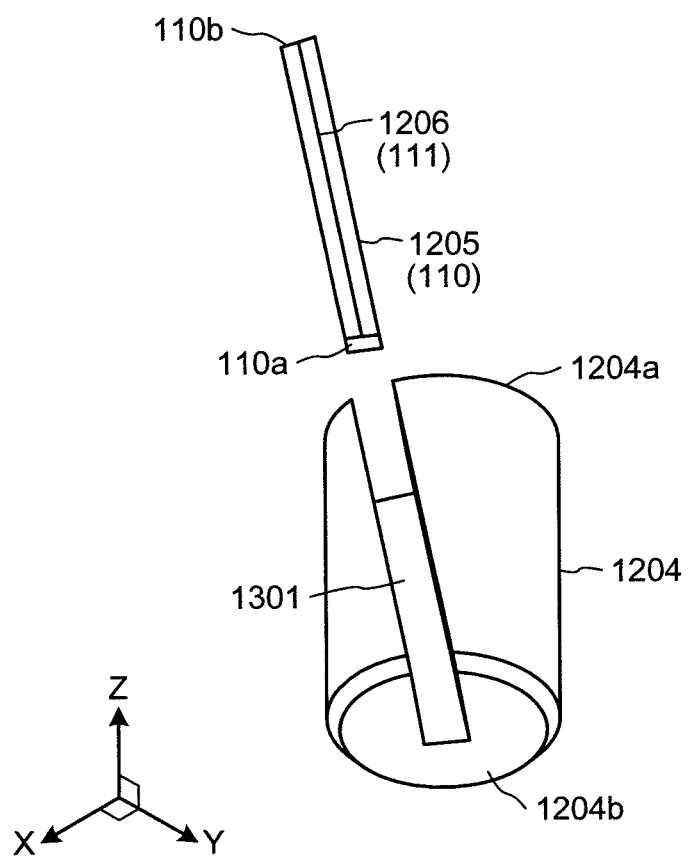
FIG. 13 is a perspective view of an SHG holder.

FIG. 13 is perspective view of an SHG holder. As depicted in FIG. 13, the SHG device holder takes a cylindrical form.

From a central portion of an undersurface 1204b to an upper surface 1204a, a groove 1301 explained above having a tilt angle of $\theta_{w1}$ is formed. The SHG device holder 1204 is made of, for example, SUS 304.

The above mentioned SHG device 1205 is fixed by, for example, epoxy-based adhesive into the groove 1301 of the SHG device holder 1204. Also with reference to FIG. 5, the input end face 110a of the SHG device 1205 is positioned in the undersurface 1204b of the SHG device holder 1204. The output end face 110b is positioned in the upper surface 1204a of the SHG device holder 1204.

In this way, the output end face 101b of the LD 101 and the input end face 110a of the SHG device 1205 are kept in parallel as depicted in FIG. 5, thereby enabling the direct coupling (butt coupling) of the LD 101 and the SHG device 1205. The LD 101 and the SHG device 1205 can be moved (optical axes can be adjusted) along the X and Y axes independently of the Z-axis and vice versa (adjustment of optical axes will be explained later).

The SHG device holder 1204 fits into the guide hole 1213 of the flange 1203, being movable in the Z-axis direction. A central axis of the holder 1204 matches the central axis of the flange 1203. Thus the SHG device 1205 is movable in the Z-axis direction together with the SHG device holder 1204.

Red or infrared laser light emitted from the LD 101 mounted on the base 1101 of the laser source 1100 goes through the optical waveguide 1206 (111) of the SHG device 1205, is wavelength-converted to be green (for example) SH wave laser light, and goes through the filter 1103 to be emitted.

(Adjustment of Optical Axis)

Figure 14:
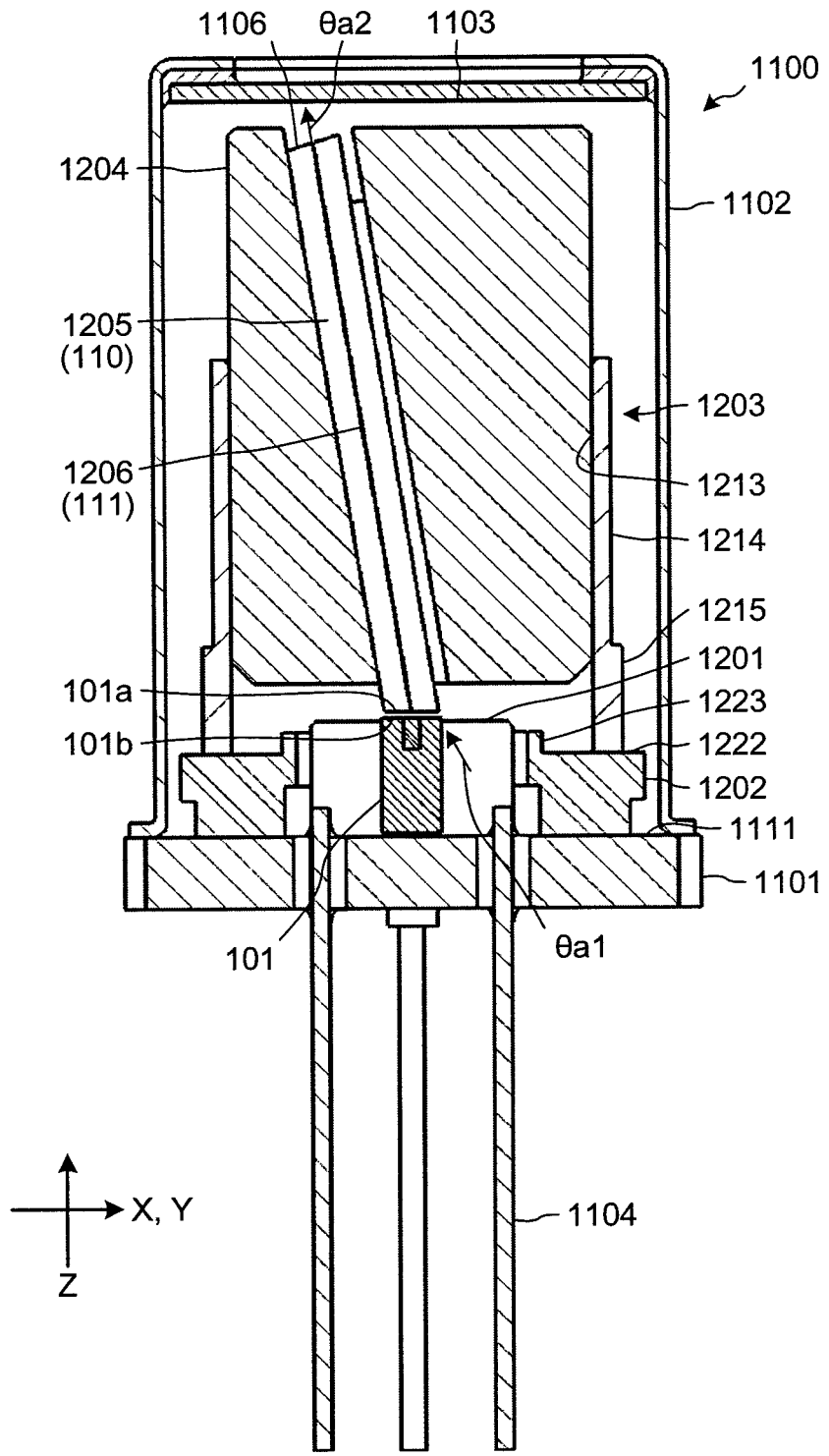
FIG. 14 is a frontal cross section of the entire laser source.
Figure 15:
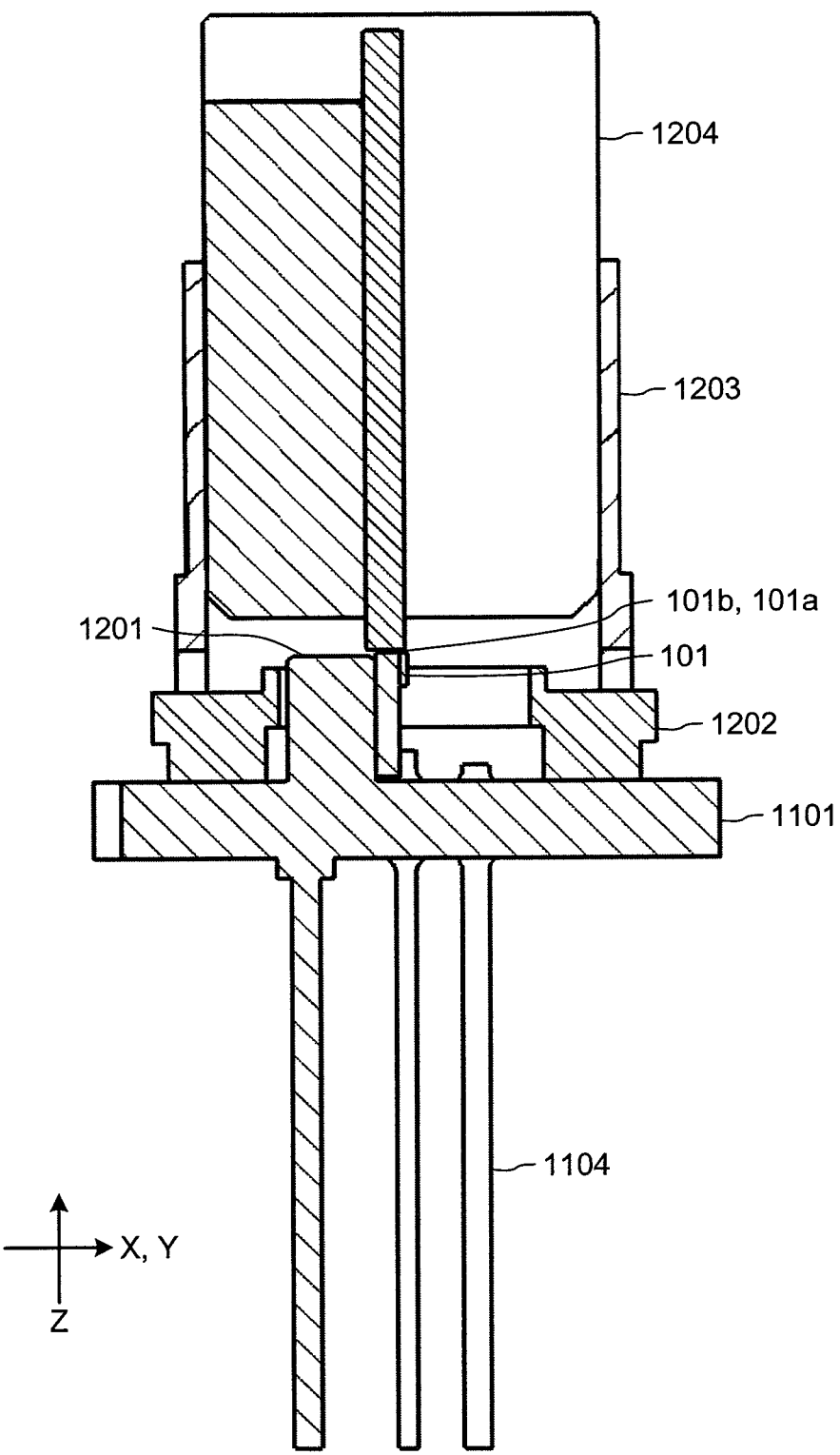
FIG. 15 is a sectional side view of the SHG device of the laser source.

A method of optical axes adjustment for the laser source 1100 is explained. FIG. 14 is frontal cross section of the entire laser source. FIG. 15 is sectional side view of the SHG device of the laser source. FIG. 14 illustrates cross section along line A-A in FIG. 12, along a face of the SHG device 1205.

In FIG. 14, light emitted from the LD 101 is tilted at $\theta_{a1}$ with respect to the Z-axis. The groove 1301 of the SHG device holder 1204 is tilted at $\theta_{w1}$. The input end face 110a of the SHG device 1205 has been cut at $\theta_{w1}$ with respect to the X-Y plane. The output end face 110b has been cut at $\theta_{w2}$. The laser source 1100 emits light at angle $\theta_{a2}$ with respect to the Z-axis (see for example FIG. 5).

An adjustment device (not shown) moves the flange 1203 in the X- and Y-axis direction and moves the SHG device holder 1204 in the Z-axis direction. The adjustment is performed based on images of a fundamental wave and an SH wave captured by a camera (not shown). The fundamental wave and the SH wave are monitored independently by switching an optical filter disposed in a front part of the camera. The position adjustment in the Z-axis direction is equivalent to the adjustment of space between the LD 101 and the input end face 110a of the SHG device 1205 and is performed by moving the SHG device holder 1204 supported by the flange 1203 in the Z-axis direction. The position adjustment in the X- and Y-axis direction is performed by moving the flange 1203 back and forth and from side to side with the undersurface of the flange part 1215 of the flange 1203 in contact with the plane part 1111 of the base 1101.

At a position of the SHG device holder 1204 where the intensity of the laser light (fundamental wave and converted SH wave) emitted from the laser source 1100 is maximized, multiple locations of the torso part 1214 of the flange 1203 are irradiated simultaneously with laser of a laser spot welding machine (YAG welder) thereby fastening the torso part 1214 of the flange and the SHG device holder 1204. In this way, the optical axis adjustment in the Z-axis direction is finished.

The optical axis adjustment in the X- and Y-axes is performed next. In order to adjust optical axis in the X- and Y-axes, the flange 1203 is moved along the X- and Y-axes direction on the plane part 1111 of the base 1101 so that the light intensity of the laser light (fundamental wave and SH wave) is maximized. At a position of the flange 1203 where the intensity of the laser light (fundamental wave and SH wave) is maximized, multiple locations of the flange part 1215 of the flange 1203 are irradiated simultaneously with laser of the laser spot welding machine, thereby fastening the undersurface of the flange part 1215 of the flange 1203 on the base 1101.

As explained above, the output end face 101b of the LD 101 and the input end face 110a of the SHG device 1205 are parallel to the X-Y plane. Further, the flange 1203 and the SHG device holder 1204 enable separate adjustment of the optical axis in the X-Y plane and the Z-axis direction. As a result, even if light emitted from the LD 101 is tilted at $\theta_{a1}$ and the optical wave guide 1206 of the SHG device (optical waveguide 111 of the optical device 110) is tilted at $\theta_{w1}$, the optical axis adjustment can be performed with an existing adjustment device, whereby an assembly process becomes easy and accurate.

The LD 101 and the SHG device 1205 (optical device 110) can be coupled directly even without a lens. As a result, the size in the Z-axis direction is reduced eliminating space for the lens, the assembly becomes easier, and reduction of the number of parts also reduces costs.

In the explanation above, the optical device 110 is the x-cut or y-cut PPLN but a z-cut PPLN may be used. FIG. 16 is a diagram illustrating a laser source according to another embodiment. In this figure, the z-cut PPLN is illustrated.

When the z-cut PPLN is used, the position of the laser device 101 explained with reference to FIG. 1 remains unchanged and the optical device 110 is positioned with the undersurface being orthogonal to the laser device 101 so that the polarization direction of the light emitted from the laser device 101 coincides with the z-axis, an optical axis of extraordinary light of lithium niobate crystal. In an example depicted in the figure, the optical waveguide 111 faces downward. The input end face 110a of the optical device 110 is polished so that when the optical device 110 is tilted at $\theta_{w1}$, the input end face 110a of the optical device 110 becomes parallel to the output end face 101b of the laser device 101.

In the explanation above, the x-cut, y-cut, and z-cut PPLN are used for the wavelength conversion optical device 110 but a substrate in which a tilted angle of a crystal axis of a PPLN falls within 10 degrees may be used in each embodiment. Further, in the embodiment in which the exit direction from the optical device 110 is adjusted to be parallel to the Z-axis, being parallel to the Z-axis is preferable but practically the exit direction may be tilted within 10 degrees with respect to the Z-axis.

According to the laser source explained above, light can be emitted from the laser device in an oblique direction with a given angle using the curved waveguide inside the laser device, thereby reducing loss of light. The laser source enables direct coupling of obliquely emitted light between the laser device and the optical device such as the SHG device, thereby reducing loss of light.

Furthermore, since the output end face of the laser source is parallel to the input end face of the optical device, adjustment in the Z-axis direction, the optical axis direction, can be performed independently of adjustment along the X-Y plane, whereby a laser source that improves accuracy of assembly and optical axis adjustment can be provided.

INDUSTRIAL APPLICATION

As described, the laser source according to the present invention is useful as a laser source emitting light through an optical device disposed downstream from a laser device that includes a curved waveguide; and is particularly applicable to a light source in a display system such as an optical communication system and laser projector. A wavelength converting device such as an SHG device, or a modulating device is applicable as the optical device.

What is claimed is:

1. A laser source comprising:
    a laser device configured to include a linear current injection region and a curved optical waveguide and emit laser light at a given angle with respect to a normal of an output end face; and
    an optical device configured to include an optical waveguide that guides, wavelength-converts the laser light, and outputs the laser light as converted light, wherein
    the output end face of the laser device is parallel to an input end face of the optical device, and
    in order for the linear current injection region of the laser device and a direction of outgoing light from the laser device to be parallel,
    the optical device is formed such that the optical waveguide extends in a direction of $\theta_{w1}$ that is given by $\theta_{w1} = \arcsin(\sin \theta_{a1}/n_{eF})$ where $\theta_{a1}$ denotes an outgoing angle of the laser light from the laser device, and $n_{eF}$ denotes an effective refractive index of the optical waveguide for a fundamental wave of the laser light,
    extraordinary light axis of crystal of the optical waveguide is perpendicular to the direction of $\theta_{w1}$, and equations $\theta_{w2} = \arctan(\sin \theta_{w1}/(n_{eSH} - \cos \theta_{w1}))$ and $\theta_{w2} = \theta_{w1} - \theta_{a2}$ are satisfied, where $n_{eSH}$ denotes an effective refractive index of the optical waveguide for the converted light, $\theta_{w2}$ denotes an angle between the direction of the optical waveguide and a normal of an output face of the wavelength conversion element, and $\theta_{a2}$ denotes a refraction angle of outgoing light with respect to the normal of the output face of the wavelength conversion element.

2. The laser source according to claim 1, wherein
    polarized light of the laser light of the laser device is a TE mode along a substrate, and
    the wavelength conversion element is an x-cut or y-cut where polarization inversion is formed along a horizontal direction with respect to the substrate; or an x-cut or y-cut having a tilted angle within 10 degrees.

3. The laser source according to claim 1, wherein the laser light of the laser device is directly coupled to the optical waveguide of the optical device.

4. The laser source according to claim 1, further comprising:
    a base configured to hold the laser device so that the laser light is emitted from the laser device at the angle of θa1; and
    a support member configured to be arranged on the base and support the optical device so that the optical waveguide has the angle of θw1 taking account of the angle of the emitted laser light, wherein
    the support member is arranged so that the support member is movable in a direction parallel to a face of the base independently of a direction perpendicular to the face of the base, and movable in the direction perpendicular to the face of the base independently of the direction parallel to the face of the base.

5. The laser source according to claim 1, wherein the laser device is made of an anisotropic medium and the optical waveguide is formed in a direction perpendicular to an anisotropic axis of the anisotropic medium.

* * * * *

UNITED STATES PATENT AND TRADEMARK OFFICE
CERTIFICATE OF CORRECTION

PATENT NO. : 8,451,530 B2
APPLICATION NO. : 12/902821
DATED : May 28, 2013
INVENTOR(S) : Masafumi Ide, Takaaki Nozaki and Takeo Komiyama It is certified that error appears in the above-identified patent and that said Letters Patent is hereby corrected as shown below:

In the Claims:

- Claim 1, column 11, line 39 " $\theta_{w2}=\theta_{w1}=\theta_{a2}$ " should be $\theta_{w2}+\theta_{w1}=\theta_{a2}$ Signed and Sealed this
Twenty-third Day of July, 2013

Teresa Stanek Rea
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 8,451,530 B2 | Page 1 of 1 |
| APPLICATION NO. | : 12/902821 | |
| DATED | : May 28, 2013 | |
| INVENTOR(S) | : Ide et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 215 days.

Signed and Sealed this

Thirteenth Day of January, 2015

Michelle K. Lee
*Deputy Director of the United States Patent and Trademark Office*